(12) United States Patent
Inoue

(10) Patent No.: US 6,240,049 B1
(45) Date of Patent: May 29, 2001

(54) SYNCHRONOUS SEMICONDUCTOR STORAGE DEVICE

(75) Inventor: Kouji Inoue, Ikoma (JP)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 09/605,888

(22) Filed: Jun. 29, 2000

(30) Foreign Application Priority Data

Jul. 2, 1999 (JP) .................................................. 11-189016

(51) Int. Cl.$^7$ ........................................................ G11C 7/00

(52) U.S. Cl. ............................................ 365/233; 365/203

(58) Field of Search ..................................... 365/233, 203

(56) References Cited

U.S. PATENT DOCUMENTS 6,137,720 * 10/2000 Lancaster .......................... 365/185.11

* cited by examiner

*Primary Examiner*—David Nelms
*Assistant Examiner*—M. Tran
(74) *Attorney, Agent, or Firm*—Morrison & Foerster LLP

(57) ABSTRACT

In a synchronous semiconductor storage device, upon latching potentials of a bit line by a sense amplifier in a read operation, a bit line disconnecting circuit disconnects the bit line and an associated reference line from the sense amplifier until a next read operation. At the same time, a virtual GND line disconnecting circuit disconnects a corresponding virtual GND line from the ground potential until the next read operation. After the disconnection of the bit line, the reference line, and the virtual line, the precharge operation of the bit line and virtual line by the VREF level supply circuits is performed in parallel with the amplifying operation by the sense amplifier. This allows an access with a CAS latency of 3.

4 Claims, 12 Drawing Sheets

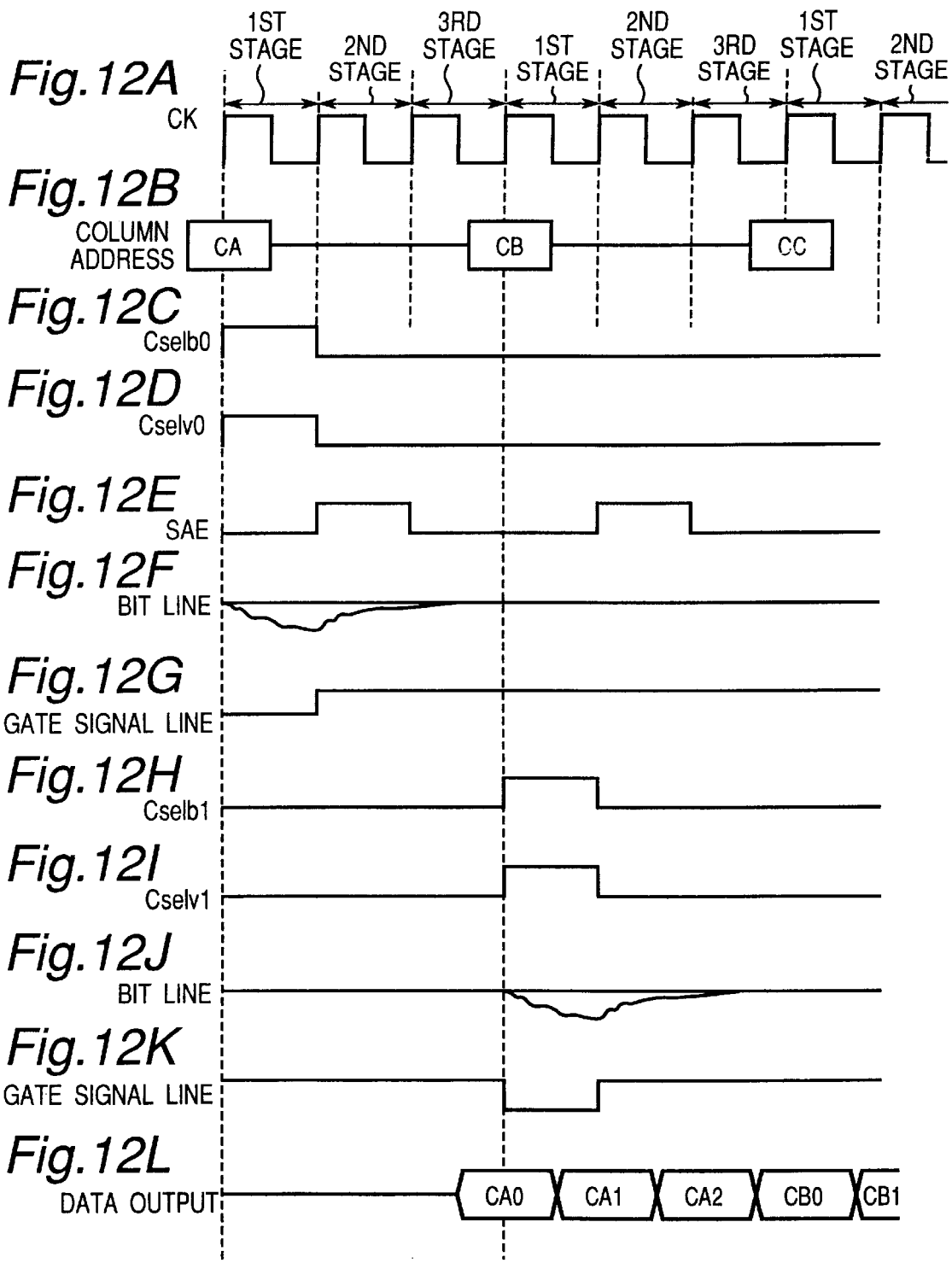

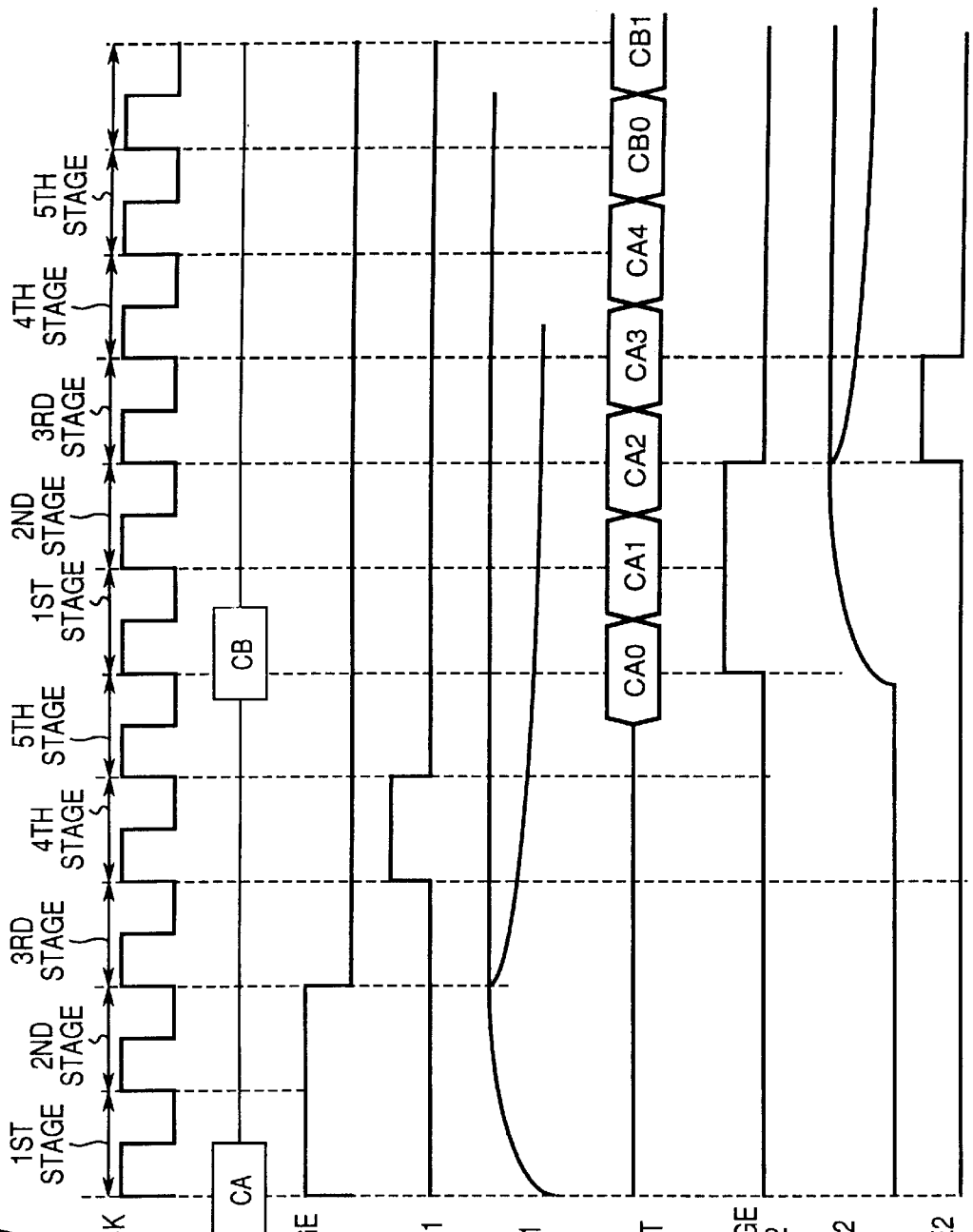

SYNCHRONOUS SEMICONDUCTOR STORAGE DEVICE

BACKGROUND OF THE INVENTION

The present invention relates to a synchronous semiconductor storage device whose internal circuit operates in synchronization with a system clock.

Conventionally, as a synchronous semiconductor storage device, there is a synchronous masked ROM that operates at a system clock of 100 MHz according to the control timing shown in FIGS. 13A through 13I. In this synchronous masked ROM (referred to as a 'synchronous MROM' hereinafter), a word line is made to rise, or turned on after the input of a row address, and a desired column selector is enabled after the input of a column address shown in FIG. 13B, to charge selected bit lines 1 and 2 shown in FIGS. 13E and 13H and a virtual GND line up to a precharge level on the basis of precharging timings 1 and 2 shown in FIGS. 13C and 13G, respectively (the first and second stages in two cycles). Next, in each cycle, the bit line sensing, or the bit line drawing by the selected memory cell, is performed (the third stage). Next, a potential difference between the bit line and a reference line is amplified by a sense amplifier when the sense amplifier enabling signal SAE1, SAE2 (shown in FIGS. 13D and 13I) has an H-level (the fourth stage). Finally, data CA0, CA1, . . . shown in FIG. 13F are sequentially output (the fifth stage). The CAS latency in this case is five. The term 'CAS latency' means the number of cycles of a clock CK (shown in FIG. 13A) from the input of a column address that is an input command, to the output of read data.

As described above, in the aforementioned synchronous MROM, the memory cell reading operation and the precharge operation of the bit line and the virtual GND line are independently executed.

According to the control timing of the synchronous MROM, five clock pulses are necessary during the time from the column address input to the read data output (namely, CAS latency: 5). In contrast to this, the operation of a synchronous dynamic RAM (referred to as a 'synchronous DRAM' hereinafter) has a CAS latency of 2 or 3 from the column address input to the read data output when the system clock of 100 MHz is used. That is, in the synchronous DRAM, the read data is output in 20 ns or 30 ns from the column address input. In contrast to this, the synchronous MROM generally has a CAS latency of 5 (or 6) from the column address input to the read data output when the system clock of 100 MHz is used. That is, in the synchronous MROM, the read data is output in 50 ns (or 60 ns) from the column address input.

As described above, the synchronous MROM, in which the memory cell read operation and the precharge operation of the bit lines and the virtual GND line are independently executed, has a CAS latency of 5, meaning that the access becomes slower than that of the synchronous DRAM. Therefore, in a system using both the synchronous MROM and the synchronous DRAM, system performance disadvantageously deteriorates by the synchronous MROM that has a longer access time.

SUMMARY OF THE INVENTION

Accordingly, an object of the present invention is to provide a synchronous semiconductor storage device capable of executing a read operation in an access time equivalent to that of the synchronous DRAM without increasing a standby current nor an operating current.

In order to accomplish the object, a synchronous semiconductor storage device comprises:
 a plurality of memory blocks into which a plurality of memory cells arranged in a matrix form have been divided every plural number of columns;
 word lines each activating the memory cells of an identical row in each memory block;
 bit lines each connected to one terminal of the memory cells of an identical column of each memory block;
 virtual GND lines each connected to the other terminal of the memory cells of an identical column of each memory block;
 a column selector that selects any one of the memory blocks on the basis of an input column address in a read operation;
 a sense amplifier that holds and amplifies a signal representing a level difference between a reference line and the bit line of the memory block selected by the column selector;
 a precharge level supply circuit that supplies a precharge level to the bit lines and the virtual GND lines of the memory blocks other than the memory block selected by the column selector; and
 a disconnecting circuit that, upon latching of the signal representing the level difference between the reference line and the bit line by the sense amplifier in the read operation, disconnects the bit line and the reference line from the sense amplifier until a next read operation and also disconnects the virtual GND line from the ground potential until the next read operation.

In the synchronous semiconductor storage device having the above construction, the charging (precharge operations) of all the bit lines and all the virtual GND lines has been completed by the precharge level supply circuit at the time when the word line for activating memory cells has risen, or has been turned on. Next, any one of the memory blocks is selected from the plurality of memory blocks by the column selector on the basis of the input column address, and the bit line sense (drawing) operation is executed in the selected memory block (the first stage). In the bit line sense operation, the potential, or level, of the bit line lowers if the memory cell being read is a transistor in an on state, while the bit line maintains the precharge level if the memory cell being read is a transistor in an off state. Next, after the signal representing the potential difference between the bit line and the reference line gets held or latched by the sense amplifier, then the bit line and the reference line that have been connected to the sense amplifier and the virtual GND line that have been connected to the ground potential are disconnected from the sense amplifier and the ground potential, respectively, by the disconnecting circuit until the next read operation, and the signal representing the retained level difference is amplified by the memory sense amplifier (the second stage). In this stage, the precharge level supply circuit supplies the precharge level to the bit lines and the virtual GND lines disconnected by the disconnecting circuit, making all the bit lines and all the virtual GND lines again have the precharge level. Then, the data amplified by the sense amplifier is output (the third stage). As described above, by completing the precharging of all the bit lines and all the virtual GND lines before the column address input and executing parallel the precharge operation of the bit lines and the virtual GND lines and the amplifying operation by the sense amplifier in the read operation, the CAS latency of 3 that is the same as that of the synchronous DRAM is achieved. Thus, in a system using both the synchronous DRAM and the synchronous MROM, the throuput can be improved. In addition, the precharge levels of all the bit lines and all the virtual GND lines are consistently maintained before the column address input. Accordingly, it is possible to realize a synchronous semiconductor storage device that can execute the read operation in an access time equivalent to that of the synchronous DRAM, without increasing the standby current nor the operating current.

In one embodiment, the precharge level supply circuit retains all the bit lines and virtual GND lines at the precharge level in a standby stage, and in the read operation, stops supplying the precharge level to the bit lines and the virtual GND lines of the memory block selected by the column selector while retaining the precharge level of the bit lines and the virtual GND lines of the memory blocks other than the selected memory block. The bit line sensing (drawing) for the memory cell is thus achieved in the first stage.

In one embodiment, the synchronous semiconductor storage device further comprises:

a normal precharge level generating circuit that forms a normal precharge level to be supplied to the bit lines and the virtual GND lines;

a power-on stage precharge level generating circuit that forms a power-on stage precharge level to be supplied to the bit lines and the virtual GND lines in a rise time slower than that of the normal precharge level generating circuit; and a precharge level changeover circuit that supplies the power-on stage precharge level formed by the power-on stage precharge level generating circuit to the precharge level supply circuit in a power supply start stage, and thereafter, changes the precharge level to the normal precharge level formed by the normal precharge level generating circuit upon recognizing that the precharging of all the bit lines and the virtual GND lines with the power-on stage precharge level via the precharge level supply circuit has been completed, to supply the normal precharge level to the precharge level supply circuit.

In this embodiment, by supplying the precharge level to all the bit lines and the virtual GND lines with a rise time of, for example, several microseconds ($\mu s$) by the power-on stage precharge level generating circuit in the power-on stage, the instantaneous current due to the whole bits precharging operation can be restrained. Next, the precharge level changeover circuit compares the precharge level formed by the power-on stage precharge level generating circuit with the precharge level formed by the normal precharge level generating circuit. When the precharge level supplied from the power-on stage precharge level generating circuit reaches a specified value, the precharge level is switched to the normal precharge level formed by the normal precharge level generating circuit so as to output the normal precharge level to the precharge level supply circuit. By this operation, the precharge level supply circuit is improved in the capacity of supplying the precharge level, so that the circuit is allowed to instantaneously supply the precharge level in the read operation.

Other objects, features and advantages of the present invention will be obvious from the following description.

BRIEF DESCRIPTION OF THE DRAWINGS

The present invention will become more fully understood from the detailed description given hereinbelow and the accompanying drawings which are given by way of illustration only, and thus are not limitative of the present invention, and wherein:

FIGS. 12A, 12B, 12C, 12D, 12E, 12F, 12G, 12H, 12I, 12J, 12K, and 12L are timing charts for the synchronous MROM; and FIGS. 13A, 13B, 13C, 13D, 13E, 13F, 13G, 13H, and 13I are timing charts for a related-art synchronous MROM.

DETAILED DESCRIPTION OF THE PREFERRED EMBODIMENTS

Figure 1:
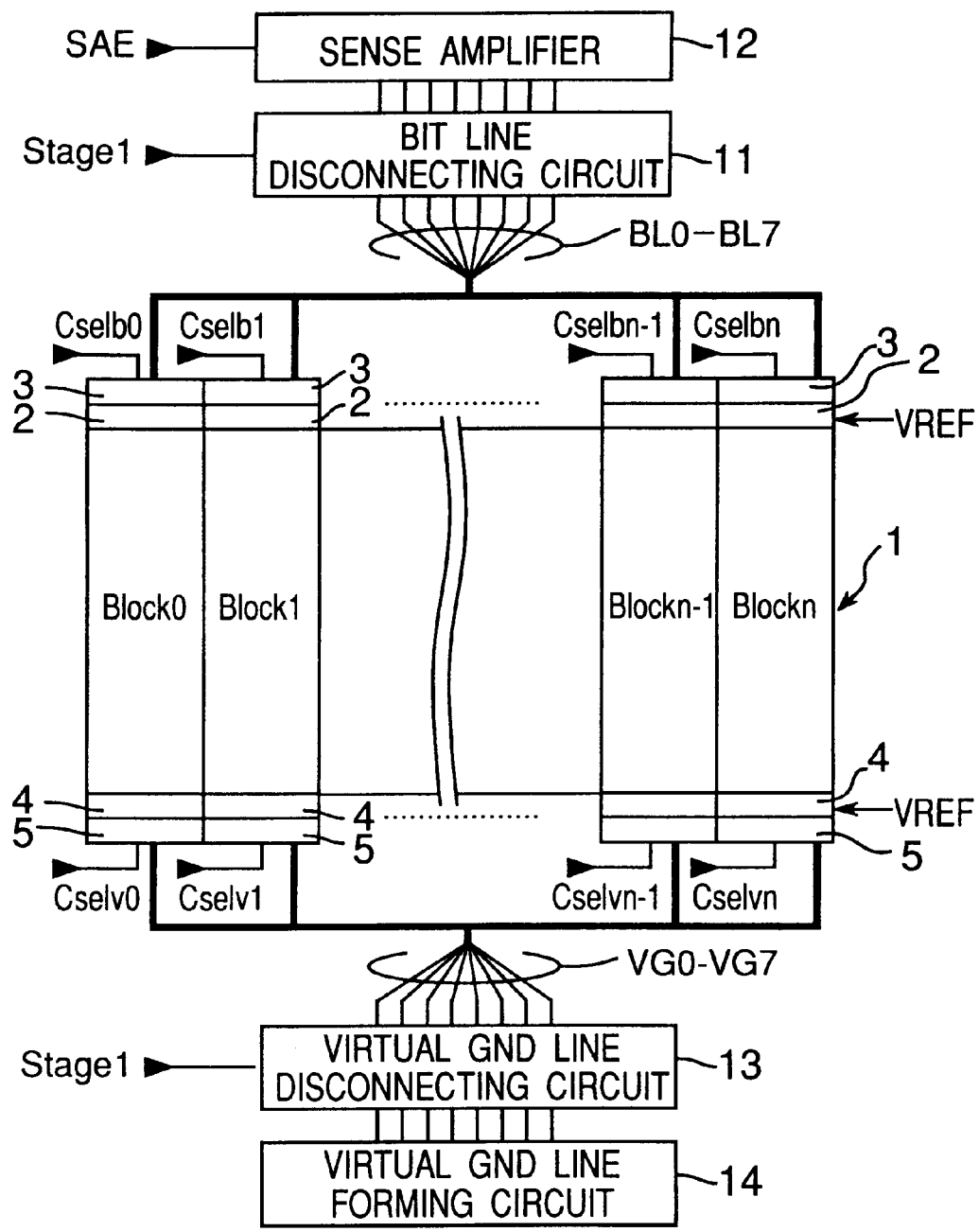
FIG. 1 is a block diagram of an essential part of a synchronous MROM that serves as a synchronous semiconductor storage device of the present invention.

The synchronous semiconductor storage device of the present invention will be described in detail below on by way of an embodiment thereof shown in the drawings.

FIG. 1 is a block diagram of an essential part of a synchronous MROM according to an embodiment of the synchronous semiconductor storage device of the present invention. As shown in FIG. 1, the synchronous MROM is provided with a memory cell array 1 that has a plurality of memory blocks Block0 through Blockn obtained by dividing every eight columns a plurality of memory cells (not shown) arranged in a matrix form. The synchronous MROM also has a VREF level supply circuit 2 that serves as a precharge level supply circuit for supplying a precharge level to bit lines BL0 through BL7 connected to one terminal of the memory cells of the memory cell array 1, and a column selector 3 that selects a memory block designated by a column address input in a read operation. The synchronous MROM also has a VREF level supply circuit 4 that serves as a precharge level supply circuit for supplying a precharge level to virtual GND lines VG0 through VG7 connected to the other terminal of the memory cells of the memory cell array 1, and a column selector 5 that selects a memory block designated by a column address input in the read operation. The synchronous MROM also has a bit line disconnecting circuit 11 that disconnects bit lines BL0 through BL7 on the basis of a first stage recognition signal Stage1, a sense amplifier 12 that amplifies a signal representing a level of a bit line BL0 through BL7 via the bit line disconnecting circuit 11 on the basis of the sense amplifier enable signal SAE, a virtual GND line disconnecting circuit 13 for disconnecting the virtual GND lines VG0 through VG7 on the basis of the first stage recognition signal Stage1, and a virtual GND line forming circuit 14 connected to the virtual GND lines VG0 through VG7 via the virtual GND line disconnecting circuit 13. The virtual GND line forming circuit 14 gives a ground potential to a desired virtual GND line VG0–VG7 according to the input address.

Figure 2:
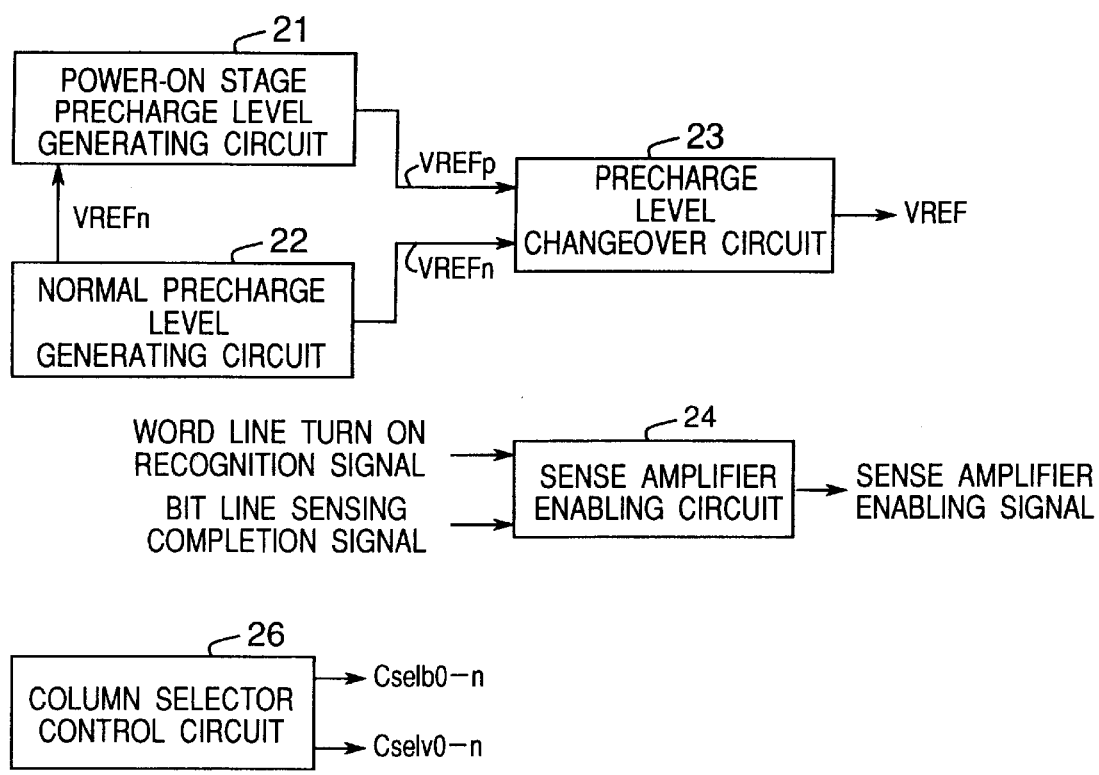
FIG. 2 is a block diagram of a peripheral section of the synchronous MROM.

As shown in FIG. 2, the synchronous MROM is provided with a power-on stage precharge level generating circuit 21 that supplies a power-on stage precharge level VREFp within a specified turn on time to all the bit lines BL0 through BL7 and the virtual GND lines VG0 through VG7 in the power supply start stage, a normal precharge level generating circuit 22 that supplies a normal precharge level VREFn to the bit lines BL0 through BL7 and the virtual GND lines VG0 through VG7 after the power supply has been turned on, and a precharge level changeover circuit 23 that outputs in a switchover manner either the power-on stage precharge level VREFp from the power-on stage precharge level generating circuit 21 or the normal precharge level VREFn from the normal precharge level generating circuit 22. Also, the synchronous MROM has a sense amplifier enabling circuit 24 that outputs a sense amplifier enable signal upon receiving a word line turn on recognition signal and a bit line sensing completion signal, and a column selector control circuit 26 that outputs column selection signals Cselb0 through Cselbn and Cselv0 through Cselvn.

Figure 3:
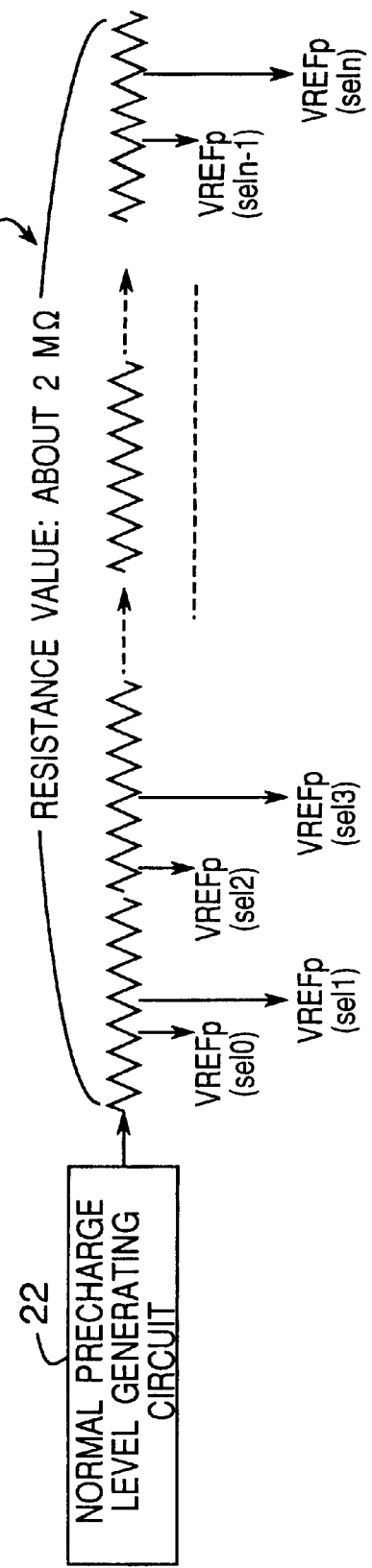
FIG. 3 shows the construction of an essential part of a power-on stage precharge level generating circuit of the synchronous MROM.

FIG. 3 is an illustration showing the construction of an essential part of the power-on stage precharge level generating circuit 21. The normal precharge level VREFn output of the normal precharge level generating circuit 22 is connected to one terminal of a series resistor R10 (about 2 MΩ) provided inside the power-on stage precharge level generating circuit 21. The series resistor R10 is constructed of a plurality of resistors connected in series.

After the power-on stage precharge level generating circuit 21 (shown in FIG. 2) detects the start of the power supply, the normal precharge level generating circuit 22 forms the normal precharge level VREFn and supplies the normal precharge level VREFn to the series resistor R10 (about 2 MΩ) provided inside the power-on stage precharge level generating circuit 21. Output signals obtained at various points of the series resistor R10, namely, the power-on stage precharge levels VREFp(sel0), VREFp(sel1), . . . , VREFp(seln) become the normal precharge level VREFn, which is supplied to the memory cell array 1.

The power-on stage precharge level generating circuit 21 is intended to charge all the bit lines with the precharge level after the start of power supply. However, if all the bit lines are instantaneously precharged, then an excessive instantaneous current is generated. Therefore, in order to restrain this instantaneous current, the normal precharge level VREFn is supplied to the inside of the memory cell array 1 in a time-sharing manner. That is, the normal precharge level VREFn is input to one terminal of the resistor R10 of about 2 MΩ, and the power-on stage precharge levels VREFp (sel0) through VREFp(seln) are taken out midway from the resistor R10 sequentially from the one terminal towards the other terminal of the resistor R10. The power-on stage precharge levels VREFp(sel0) through VREFp(seln) that have been taken out are supplied to the bit lines. With this arrangement, the precharging is executed sequentially from the bit line to which the power-on stage precharge level VREFp(sel0) is applied via a smaller resistance value to the bit line to which the power-on stage precharge level VREFp (seln) is applied via a greater resistance value. By thus precharging all the bit lines, the instantaneous current can be restrained.

Figure 4:
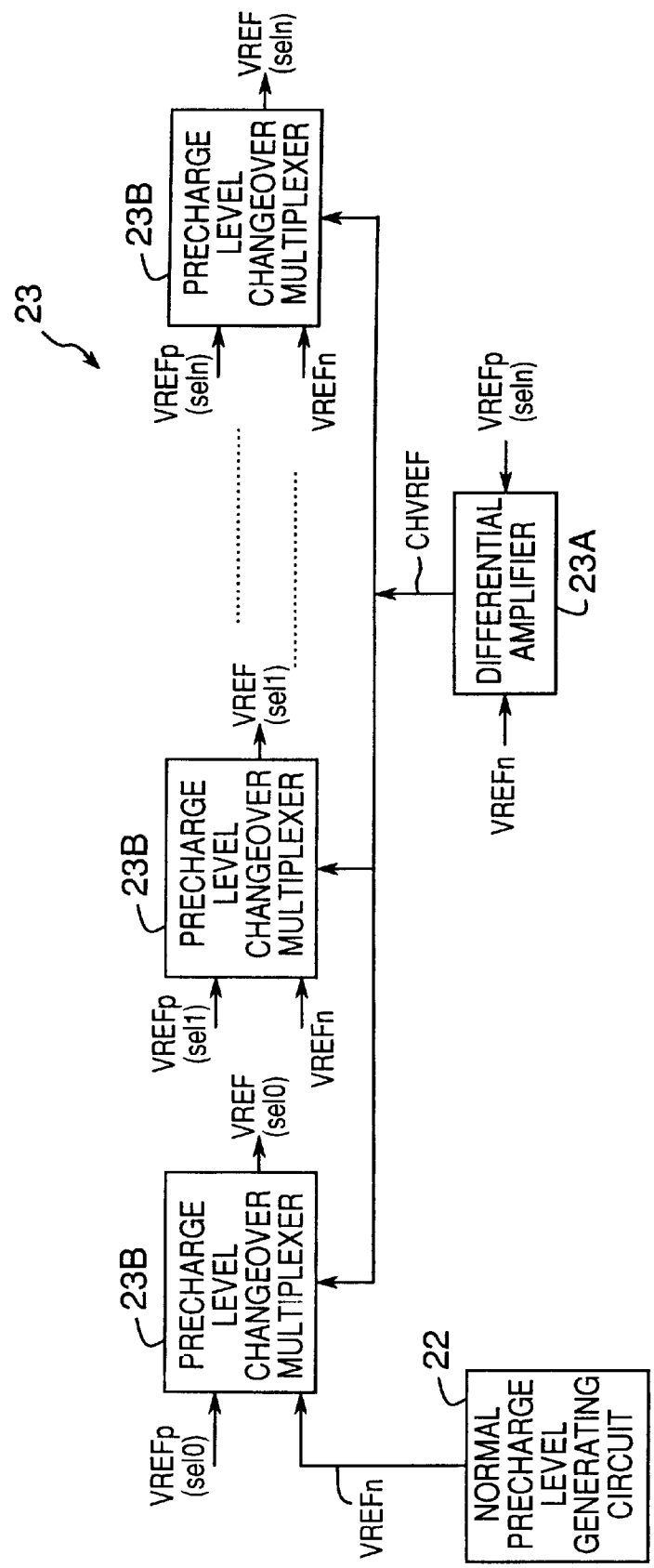
FIG. 4 is a block diagram of a precharge level changeover circuit of the synchronous MROM.

FIG. 4 shows a detailed block diagram of the precharge level changeover circuit 23 together with the normal precharge level generating circuit 22 in block. As shown in FIG. 4, the precharge level changeover circuit 23 is constructed of a differential amplifier 23A and a plurality of precharge level changeover multiplexers 23B, 23B, . . .

The power-on stage precharge level VREFp(seln) from the power-on stage precharge level generating circuit 21 (shown in FIG. 2) is input to one terminal of the differential amplifier 23A, while the normal precharge level VREFn from the normal precharge level generating circuit 22 is input to the other terminal of the differential amplifier 23A. The power-on stage precharge levels VREFp(sel0) through VREFp(seln) from the power-on stage precharge level generating circuit 21 (shown in FIG. 2) are input to one terminal of the precharge level changeover multiplexers 23B, 23B, . . . , while the normal precharge level VREFn from the normal precharge level generating circuit 22 is input to the other terminal of the precharge level changeover multiplexers 23B, 23B, . . .

As shown in FIG. 4, the differential amplifier 23A provided inside the precharge level changeover circuit 23 compares the input power-on stage precharge level VREFp (seln) with a potential or level that is four fifths (⅘) of the normal precharge level VREFn. The differential amplifier 23A outputs an H-level changeover signal CHVREF when the power-on stage precharge level VREFp (seln) exceeds the potential that is four fifths of the normal precharge level VREFn. Then, the precharge levels to be output from the precharge level changeover multiplexers 23B, 23B, . . . are changed from the power-on stage precharge levels VREFp (sel0) through VREFp(seln) to the normal precharge level VREFn on the determination that the precharging in the power supply start stage has been completed.

Figure 5:
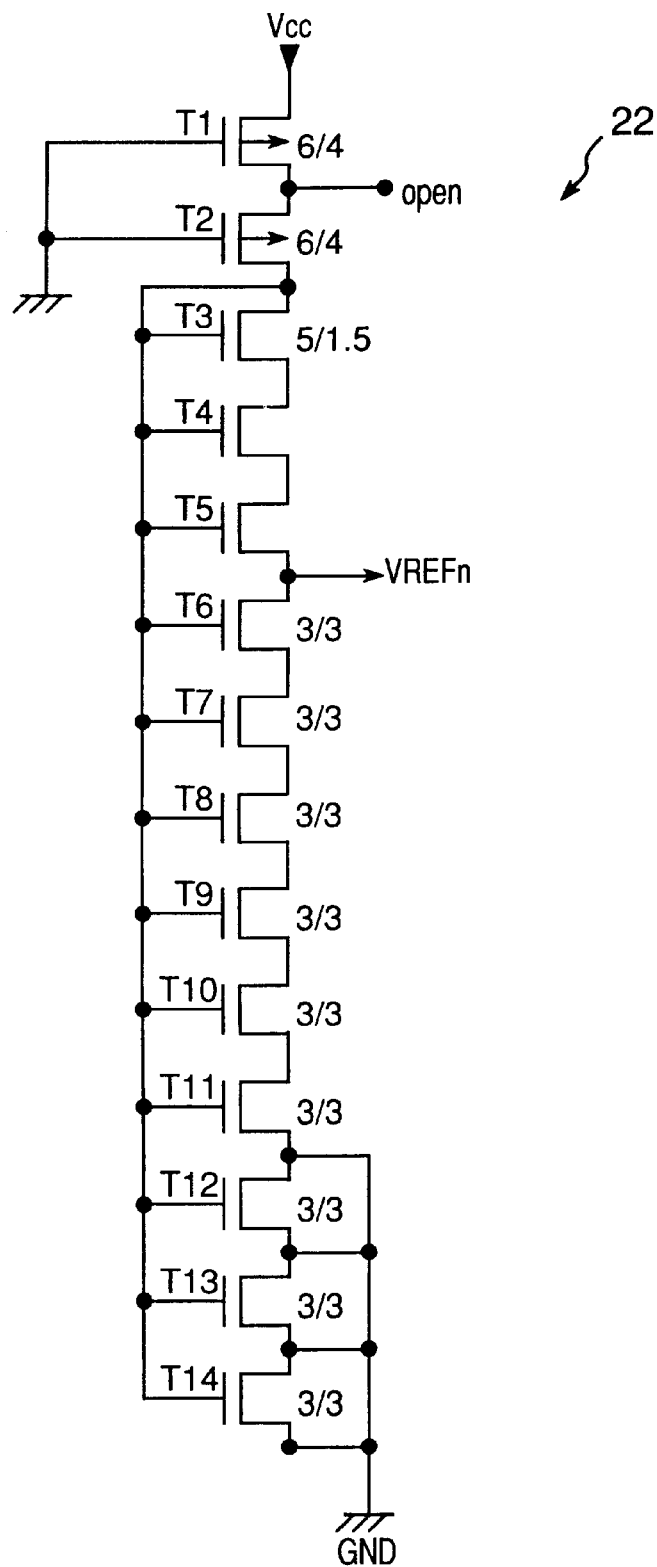
FIG. 5 is a circuit diagram of a normal precharge level generating circuit of the synchronous MROM.

FIG. 5 is a circuit diagram of the normal precharge level generating circuit 22. As shown in FIG. 5, a power voltage Vcc is applied to the source of a p-channel transistor T1 whose gate is connected to the ground GND, and the drain of the transistor T1 is connected to the source of a p-channel transistor T2. The gate of the transistor T2 is also connected to the ground GND. Then, the drain of the transistor T2 is connected to the drain of an n-channel transistor T3, and the source of the transistor T3 is connected to the drain of an n-channel transistor T4. In a similar manner, n-channel transistors T5 through T14 are connected in series. The gates of the n-channel transistors T3 through T14 are connected together, and the sources of the transistors T11 through T14 are connected to the ground GND. Then, the normal precharge level VREFn is output from the drain of the n-channel transistor T6.

Figure 6:
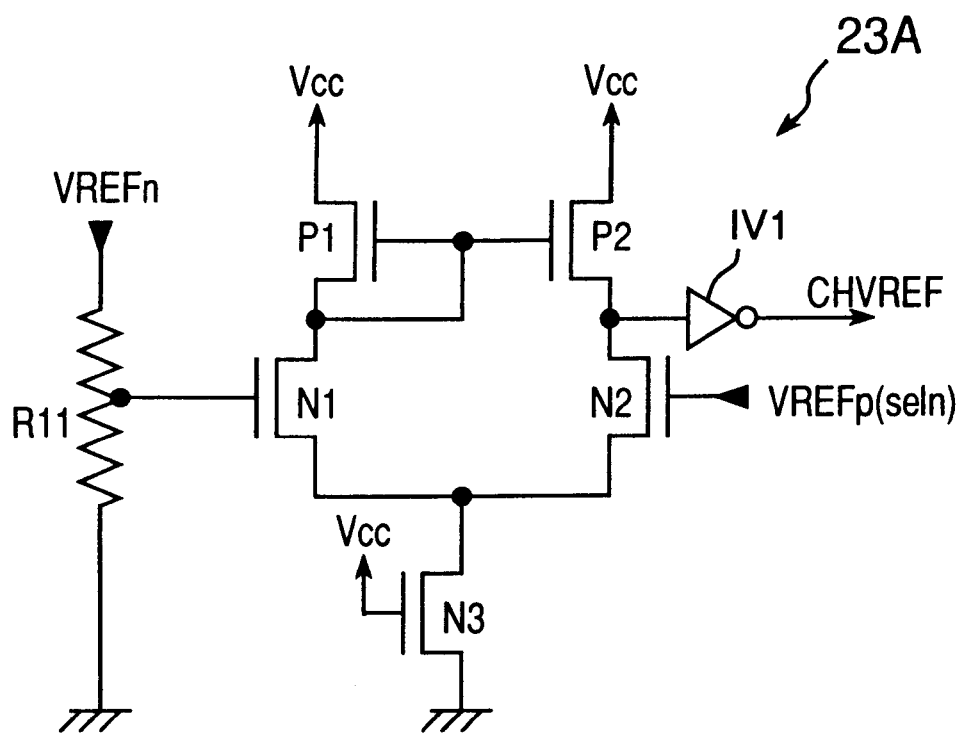
FIG. 6 is a circuit diagram of a differential amplifier of the synchronous MROM.

FIG. 6 shows a circuit diagram of the differential amplifier 23A. As shown in FIG. 6, the differential amplifier 23A includes p-channel transistors P1 and P2 that have gates connected together and sources supplied with the power voltage Vcc. The differential amplifier 23A also includes an n-channel transistor N1 that has a drain connected to the gate and drain of the transistor P1, an n-channel transistor N2 that has a drain connected to the drain of the transistor P2 and a gate supplied with the power-on stage precharge level VREFp(seln), and an n-channel transistor N3 that has a drain connected to the sources of the transistors N1 and N2 and a source connected to the ground GND. The differential amplifier 23A also includes a resistor R11 that has one terminal to which the normal precharge level VREFn is applied and the other terminal connected to the ground GND. A voltage obtained by dividing the normal precharge level VREFn by the resistor R11 is applied to the gate of the transistor N1.

The differential amplifier 23A compares the input power-on stage precharge level VREFp(seln) with the level that is four-fifths of the normal precharge level VREFn. The differential amplifier 23A outputs the H-level changeover signal CHVREF when the power-on stage precharge level VREFp(seln) exceeds the level or potential that is four-fifths of the normal precharge level VREFn.

Figure 7:
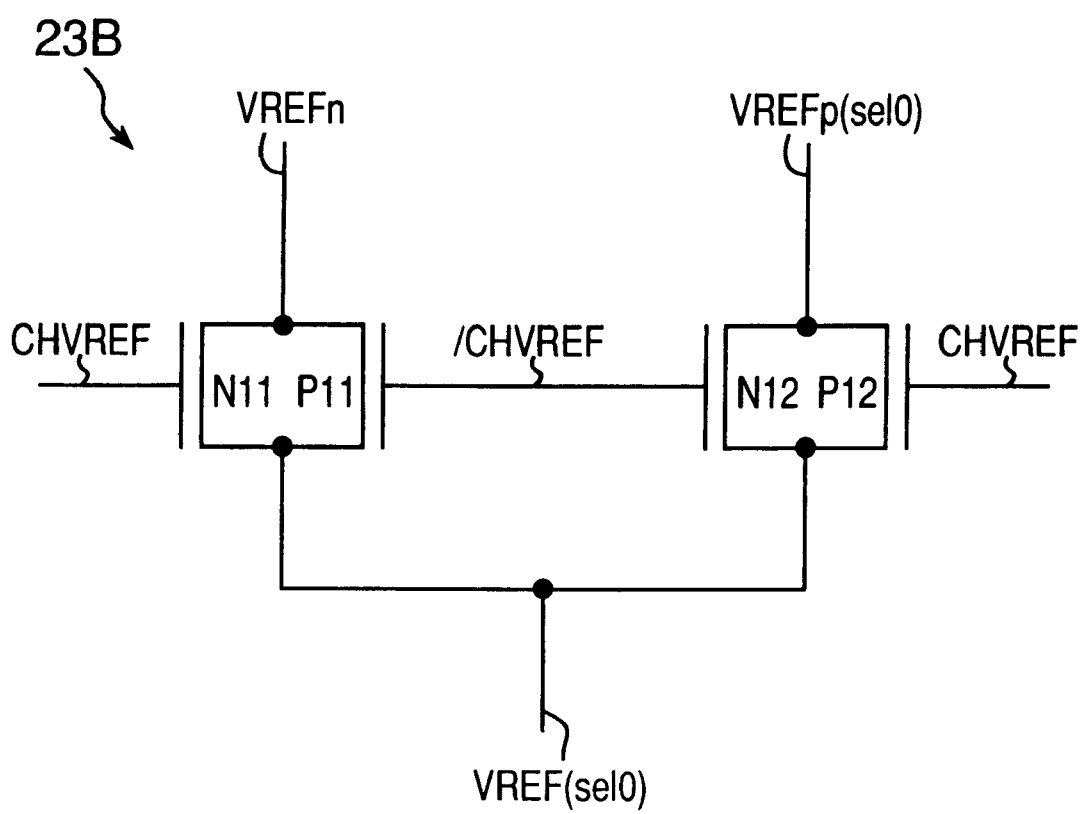
FIG. 7 is a circuit diagram of a precharge level changeover multiplexer of the synchronous MROM.

FIG. 7 shows a circuit diagram of the precharge level changeover multiplexer 23B (shown in FIG. 4). FIG. 7 shows the precharge level changeover multiplexer 23B for outputting the precharge level VREF(sel0), although the other precharge level changeover multiplexers 23B for outputting the other precharge levels VREF(sel1) through VREF(seln) have the same construction.

As shown in FIG. 7, the precharge level changeover multiplexer 23B includes an n-channel transistor N11 that has a gate supplied with the changeover signal CHVREF from the differential amplifier 23A and a drain supplied with the normal precharge level VREFn, a p-channel transistor P11 that has a source connected to the drain of the transistor N11 and a gate supplied with a changeover signal /CHVREF, an n-channel transistor N12 that has a gate connected to the gate of the transistor P11 and a drain supplied with the power-on stage precharge level VREFp (sel0), and a p-channel transistor P12 that has a source connected to the drain of the transistor N12 and a gate supplied with the changeover signal CHVREF. The sources of the transistors N11 and N12 are connected to the drains of the transistors P11 and P12, respectively. The precharge level VREF(sel0) is output from the connection point of the sources of the transistors N11 and N12 and the drains of the transistors P11 and P12.

When the changeover signal CHVREF has L-level, the precharge level changeover multiplexers 23B select the power-on stage precharge levels VREFp(sel0)–VREFp (seln) from the power-on stage normal precharge level generating circuit 21 and output the same as the precharge levels VREF(sel0) through VREF(seln), thereby supplying the precharge levels in a time-sharing manner. When the changeover signal CHVREF has H-level, the precharge level changeover multiplexers 23B select the normal precharge level VREFn which comes from the normal precharge level generating circuit 22 and has a high precharge level supply capacity, and output the same as the precharge levels VREF(sel0) through VREF(seln), thereby allowing the precharge level to be instantaneously supplied in the read operation.

Figure 8:
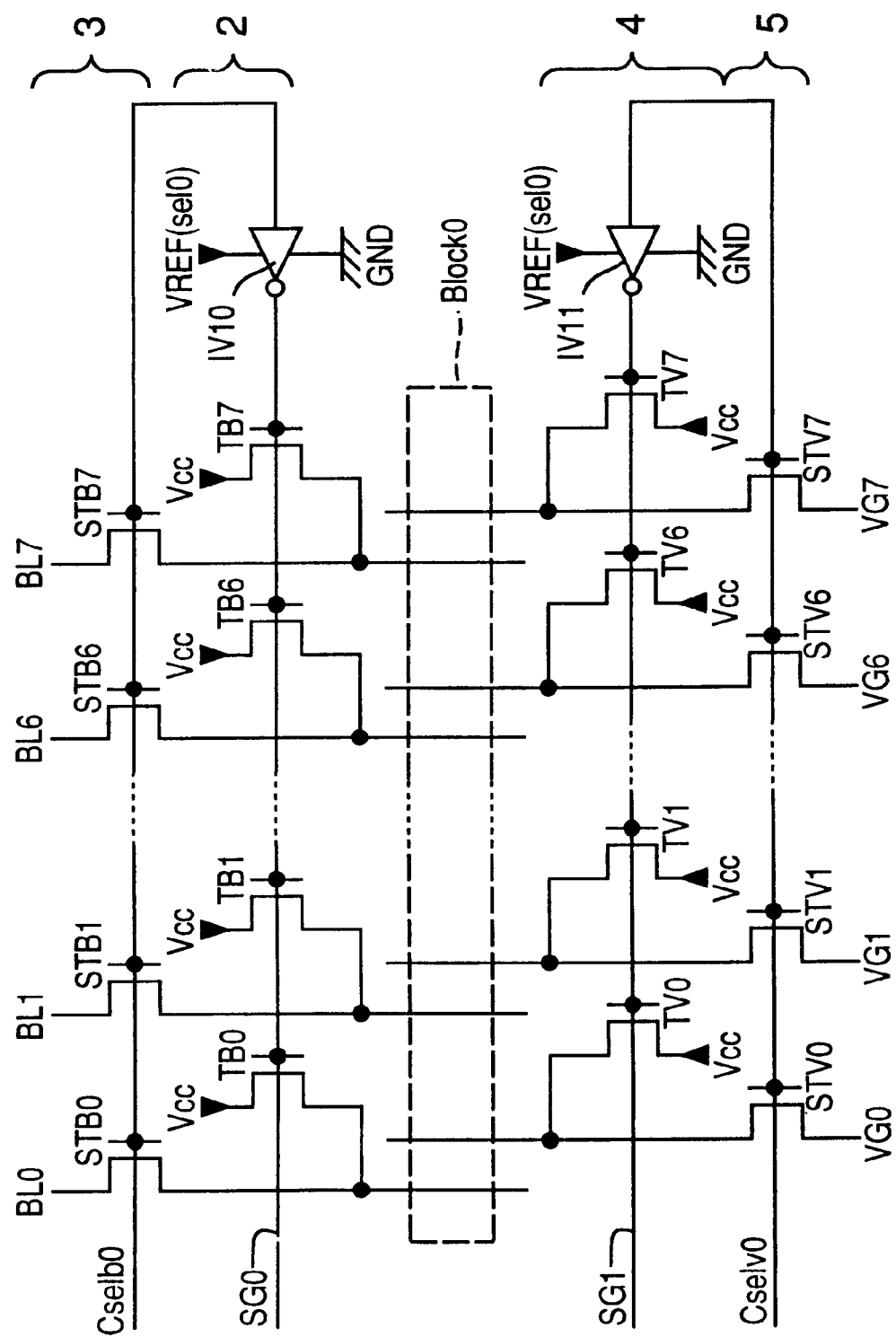
FIG. 8 is a circuit diagram of column selectors and VREF level supply circuits of the synchronous MROM.

FIG. 8 shows a circuit diagram of the memory block Block0 shown in FIG. 1, the column selectors 3 and 5, and the VREF level supply circuits 2 and 4. It is to be noted that the other memory blocks Block1 through Blockn have the same construction.

As shown in FIG. 8, each of the bit lines BL0 through BL7 are connected to one terminal of the memory cells (not shown) of an identical column of the memory block Block0 of the memory cell array 1 (shown in FIG. 1). Transistors TB0 through TB7 have one terminal connected to the bit lines BL0 through BL7, and the power voltage Vcc is applied to the other terminal of the transistors TB0 through TB7. The gates of the transistors TB0 through TB7 are connected with a gate signal line SG0, and one terminal of the gate signal line SG0 is connected with an output terminal of an inverter IV10. A column selection signal Cselb0 is supplied to an input terminal of the inverter IV10. The transistors TB0 through TB7 and the inverter IV10 constitute the VREF level supply circuit 2. The precharge voltage VREF(sel0) is applied to the power input terminal of the inverter IV10. The bit lines BL0 through BL7 are connected to the bit line disconnecting circuit 11 (shown in FIG. 1) via selection transistors STB0 through STB7, respectively. The column selection signal Cselb0 is input to the gates of the selection transistors STB0 through STB7. The selection transistors STB0 through STB7 constitute the column selector 3 (shown in FIG. 1).

On the other hand, virtual GND lines VG0 through VG7 are each connected to the other terminal of an identical column of the memory cell array 1. The virtual GND lines VG0 through VG7 are each connected with one terminal of transistors TV0 through TV7, and the power voltage Vcc is applied to the other terminal of the transistors TV0 through TV7. A gate signal line SG1 is connected to the gates of the transistors TV0 through TV7, an output terminal of an inverter IV11 is connected to one terminal of the gate signal line SG1, and a column selection signal Cselv0 is input to an input terminal of the inverter IV11. The transistors TV0 through TV7 and the inverter IV11 constitute the VREF level supply circuit 4 (shown in FIG. 1). The voltage VREF(sel0) is applied to the power input terminal of the inverter IV11. The virtual GND lines VG0 through VG7 are connected to the virtual GND line disconnecting circuit 13 (shown in FIG. 1) via selection transistors STV0 through STV7, respectively. The column selection signal Cselv0 is input to the gates of the selection transistors STV0 through STV7. The selection transistors STV0 through STV7 constitute the column selector 5 (shown in FIG. 1). It is to be noted that word lines for activating the memory cells of identical rows of the memory blocks Block0 through Blockn are provided although not shown.

In FIG. 8, both the column selection signals Cselb0 and Cselv0 of the column selectors 3 and 5 maintain L-level when power is turned on. Therefore, the gate signal line SG0 provided inside the VREF level supply circuit 2 and the gate signal line SG1 provided inside the VREF level supply circuit 4 come to a level of the precharge voltage VREF (sel0) from the precharge level changeover circuit 23. In particular, when the power is turned on, the power-on stage precharge level VREFp(sel0) of the power-on stage precharge level generating circuit 21 is selected as the precharge voltage VREF(sel0) from the precharge level changeover circuit 23, and all the bit lines BL0 through BL7 and all the virtual GND lines VG0 through VG7 are supplied with the voltage:

VREF(sel0)–Vth where Vth is a threshold voltage of the transistors TB0 through TB7 and TV0 through TV7.

Subsequently, the precharge level VREF(sel0) is changed from the power-on stage precharge level VREFp(sel0n) of the power-on stage precharge level generating circuit 21 to the normal precharge level VREFN of the normal precharge level generating circuit 22. Subsequently, in the standby stage, the normal precharge level VREFn is supplied to the gate signal line SG0 provided inside the VREF level supply circuit 2, and to the gate signal line SG1 provided inside the VREF potential supply circuit 4. Therefore, all the bit lines BL0 through BL7 and all the virtual GND lines VG0 through VG7 are supplied with the voltage:

VREFn–Vth.

It is to be noted that the potential of:

VREFp(sel0)–Vth has been supplied to all the bit lines BL0 through BL7 and all the virtual GND lines VG0 through VG7 in the power supply start stage. Therefore, the newly supplied potential merely compensates for the bit line leak and the virtual GND line leak, meaning that the standby current is considered to be about several tens of microamperes.

In the read operation, the precharge voltage of:
VREFn−Vth
is maintained on the bit lines and the virtual GND lines that are not accessed by the column address, similarly to the standby stage.

With regard to the bit line and the virtual GND line that are accessed by a column address in the read operation, the GND potential is supplied to both the gate signal line SG0 inside the VREF level supply circuit 2 and the gate signal line SG1 inside the VREF level supply circuit 4. Therefore, no precharge potential or level is supplied to those lines.

As described above, no precharge level is supplied to the bit line and the virtual GND line in the first stage in which the column address is input. This allows the sensing of the bit line at the selected memory cell.

However, in the second and subsequent stages, once the sensing has been executed by the sense amplifier 12, the accessed column selectors 3 and 5 are disabled by a column selector control circuit 26 described later, and the column selection signals Cselb0 through Cselbn and Cselv0 through Cselvn inside the accessed column selectors 3 and 5 come to have L-level. As a result, the normal precharge level VREFn is supplied to the gate signal line SG0 inside the VREF level supply circuit 2 and the gate signal line SG1 inside the VREF level supply circuit 4.

FIGS. 12A through 12I show timing charts of the synchronous MROM. FIGS. 12A through 12I show a read operation of memory blocks Block0 and Block1 selected by column addresses CA and CB in synchronization with the clock CK (shown in FIG. 12A).

First, in the first stage, the column selection signals Cselb0 and Cselv0 (shown in FIGS. 12C and 12D) are output on the basis of the column address CA so as to connect the bit lines and the virtual GND lines of the memory block Block0 to the sense amplifier 12 and the virtual GND line forming circuit 14 (shown in FIG. 1), respectively. Then, the bit line potential (shown in FIG. 12F) goes lowered if the memory cell connected to the bit line is an ON-state transistor, while the bit line maintains the precharge level if the memory cell connected therewith is an OFF-state transistor. Next, in the second stage, a sense amplifier enable signal SAE (shown in FIG. 12E) is output so as to amplify the read data by the sense amplifier 12. Also, the potentials of the gate signal lines SG0 and SG1 (shown in FIG. 12G) are raised to the H-level. Thus, the bit lines are again precharged. Then, in the third stage, CA0, CA1 and CA2 are sequentially output as output data (shown in FIG. 12I).

Likewise, the column selection signals Cselb1 and Cselv1 (shown in FIGS. 12H and 12I) are output on the basis of the column address CB in the first stage so as to connect the bit lines and the virtual GND lines of the memory block Block1 to the sense amplifier 12 and the virtual GND line forming circuit 14, respectively. Next, in the second stage, the sense amplifier enabling signal SAE (shown in FIG. 12E) is output so as to amplify the read data by the sense amplifier 12. At the same time the potentials of the gate signal lines SG0 and SG1 (shown in FIG. 12K) are raised to the H-level, so that the bit lines are again precharged. Then, in the third stage, CB0, CB1, . . . are sequentially output as output data (shown in FIG. 12I).

As described above, the precharge operations for the bit lines and virtual GND lines that have been accessed in response to the column selection signals Cselb0 and Cselv0 (shown in FIGS. 12C and 12D) are completed during the operation period (second stage) of amplifying the read data on the bit line by the sense amplifier 12 and the subsequent data output period (third stage). Therefore, when the column address CB is input three cycles after the input of the column address CA as shown in the timing chart of FIGS. 12A through 12I, the precharging of all the bit lines and the all the virtual GND lines has been completed. Consequently, when the bit line and the virtual GND line are accessed on the basis of the column address CB (first stage), the bit line sense operation for the accessed memory cell is immediately started in the selected memory block Block1 of the memory cell array 1. It is to be noted that the potential of the bit line sensed from the memory cell and the potential of the reference line are supplied to the latch type sense amplifier in the first stage, and this latch type sense amplifier latches the sense amplifier output.

By repeating the aforementioned read operation, continuous data reading can be executed by a CAS latency of 3 when the system clock of 100 MHz is used.

Figure 9:
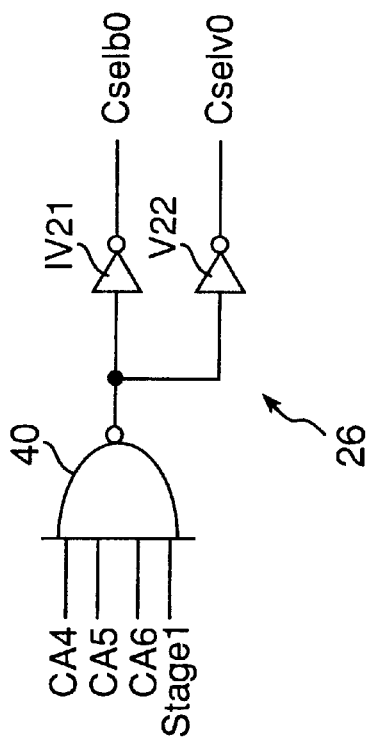
FIG. 9 is a circuit diagram of part of a column selector control circuit of the synchronous MROM.

FIG. 9 is a circuit diagram of part of the column selector control circuit 26, showing a circuit for outputting a pair of column selection signals Cselb0 and Cselv0. It is to be noted that circuits for outputting the other column selection signals Cselb1 through Cselbn and Cselv1 through Cselvn have a similar circuit construction except that the column address input conditions are different, and those circuits are not shown in FIG. 9.

As shown in FIG. 9, the column selector control circuit 26 has a four-input NAND circuit 40 to which column addresses CA4, CA5 and CA6 and a first stage recognition signal Stage 1 are input, and inverters IV21 and IV22 that have input terminals connected to the output terminals of the four-input NAND circuit 40 and output the column selection signals Cselb0−Cselbn and Cselv0−Cselvn, respectively. In the circuit of FIG. 9, three column addresses CA4, CA5 and CA6 are input, so that eight column selection signals are obtained. However, the number of column addresses to be input should be set according to the construction of the memory block and the like.

Figure 10:
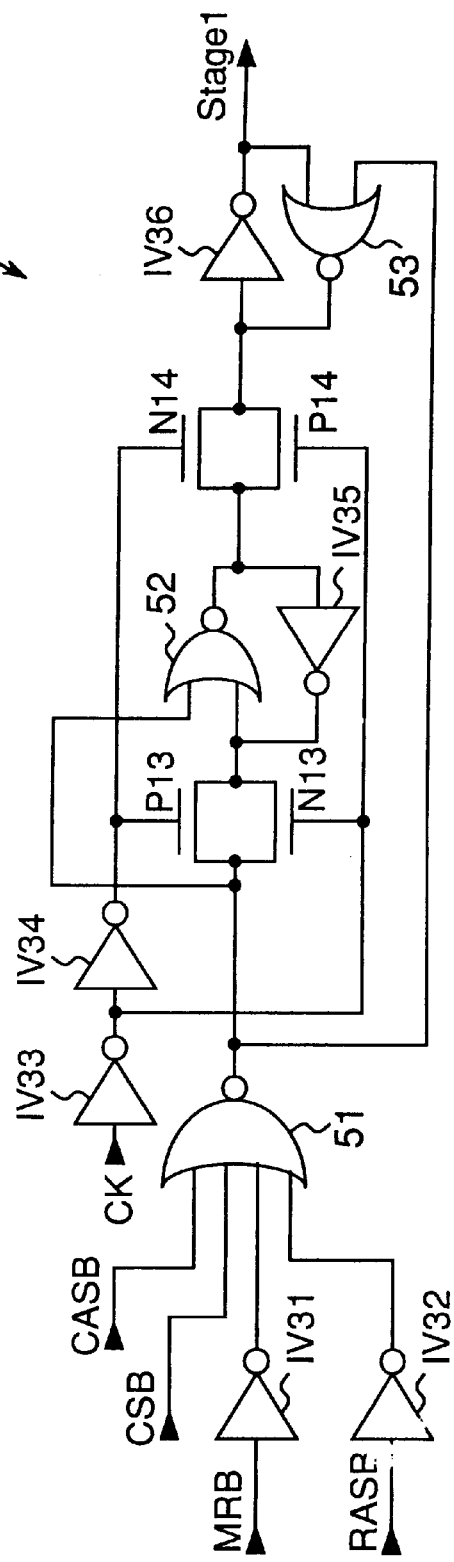
FIG. 10 is a circuit diagram of a first stage recognition circuit of the synchronous MROM.

FIG. 10 shows a circuit diagram of part of a first stage recognition circuit 27 for generating the first stage recognition signal Stage1. To a 4-input NOR circuit 51 supplied with a column address strobe signal CASB and a chip select signal CSB, a mode register setting signal MRB is fed via an inverter IV31 and a row address strobe signal RASB is fed via an inverter IV32. The output terminal of the 4-input NOR circuit 51 is connected to the drain of an n-channel transistor N13, and the clock CK is input to the gate of the transistor N13 via an inverter IV33. The drain of the transistor N13 is connected to the source of a p-channel transistor P13, and the source of the transistor N13 is connected to the drain of the transistor P13. The clock CK is fed via the inverters IV33 and IV34 to the gate of the transistor P13. The drain of the transistor N13 is connected to one input terminal of a 2-input NOR circuit 52, and the source of the transistor N13 is connected to the other input terminal of the 2-input NOR circuit 52. Then, the output terminal of the 2-input NOR circuit 52 is connected to the one input terminal of the 2-input NOR circuit 52 via an inverter IV35. Further, the output terminal of the 2-input NOR circuit 52 is connected to the drain of an n-channel transistor N14, and the gate of the transistor P13 is connected to the gate of the transistor N14. The source of the p-channel transistor P14 is connected to the drain of the transistor N14, and the drain of the transistor P14 is connected to the source of the transistor N14. The source of the transistor N14 is connected to the input terminal of an inverter IV36, and the output terminal of the inverter IV36 is connected to one input terminal of a 2-input NOR circuit 53. The other input terminal of the 2-input NOR circuit 53 is connected to the output terminal of the 4-input NOR circuit 51. Then, a first stage recognition signal Stage1 is output from the output terminal of the inverter IV36.

In order to make the first stage recognition signal Stage1 have H-level, it is necessary to input a command by means of the inputs of the column address strobe signal CASB, the chip select signal CSB, the mode register setting signal MRB and the row address strobe signal RASB. By setting the column address strobe signal CASB to L-level, the chip select signal CSB to L-level, the mode register setting signal MRB to H-level, and the row address strobe signal RASB to H-level, the command is input. The command is input every time an address is input in order to read data, and the first stage recognition circuit 27 outputs the first stage recognition signal Stage1 of H-level for a specified period.

Then, the column selector control circuit 26 shown in FIG. 9 decodes the input column addresses (CA4, CA5 and CA6). Only when the first stage recognition signal Stage1 of H-level is received from the first stage recognition circuit 27 (shown in FIG. 10) in the operating stage, desired column selection signals among the column selection signals Cselb0 through Cselbn and Cselv0 through Cselvn become H-level. As a result, the corresponding bit lines and virtual GND lines are accessed.

Figure 11:
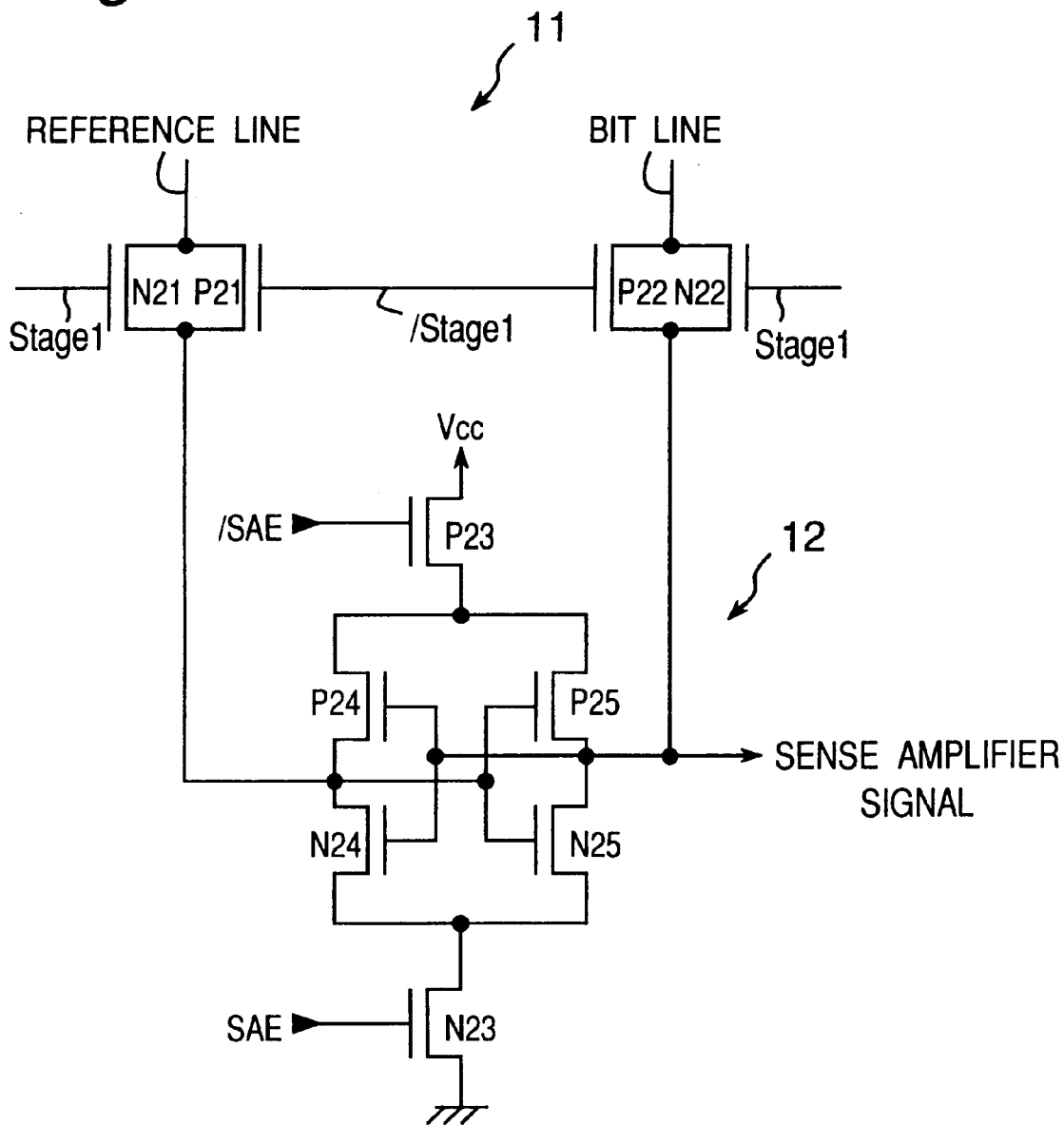
FIG. 11 is a circuit diagram of an essential part of a bit line disconnecting circuit and a sense amplifier of the synchronous MROM.

Further, FIG. 11 shows a circuit diagram of essential parts of the bit line disconnecting circuit 11 and the sense amplifier 12. A reference line is connected to the drain of an n-channel transistor N21, and the first stage recognition signal Stage1 is input from the first stage recognition circuit 27 (shown in FIG. 10) to the gate of the transistor N21. The drain of the transistor N21 is connected to the source of a p-channel transistor P21, and the source of the transistor N21 is connected to the drain of the transistor P21. An inverted first stage recognition signal /Stage1 is input to the gate of the transistor P21. The bit line is connected to the drain of an n-channel transistor N22, and the gate of the transistor N22 is fed with the first stage recognition signal Stage1 from the first stage recognition circuit 27 (shown in FIG. 10). The drain of the transistor N22 is connected to the source of a p-channel transistor P22, and the drain of the transistor P22 is connected to the source of the transistor N22. The inverted first stage recognition signal /Stage1 is input to the gate of the transistor P22. The n-channel transistors N21 and N22 and the p-channel transistors P21 and P22 are provided for each bit line, constituting the bit line disconnecting circuit 11 (shown in FIG. 1).

Then, the power voltage Vcc is applied to the source of a p-channel type transistor P23, which receives an inverted sense amplifier enable signal /SAE at its gate. The drain of the transistor P23 is connected with the source of a p-channel type transistor P24. The drain of the transistor P24 is connected with the source of the transistor N21. The drain of the transistor P24 is also connected with the drain of an n-channel transistor N24, and the source of the transistor N24 is connected to the drain of an n-channel transistor N23. The sense amplifier enable signal SAE is input to the gate of the transistor N23, and the source of the transistor N23 is connected to the ground GND. The drain of the transistor P23 is also connected to the source of a p-channel transistor P25. The drain of the transistor P25 is connected to the source of the transistor N22 and the drain of an n-channel transistor N25. The source of the transistor N25 is connected to the drain of the transistor N23. The drain of the transistor P24 is connected to the gate of the transistor P25 and the gate of the transistor N25. The drain of the transistor P25 is connected to the gate of the transistor P24 and the gate of the transistor N24. Then, a sense amplifier signal is output from a node between the drain of the transistor P25 and the drain of the transistor N25. The p-channel transistors P23, P24 and P25 and the n-channel transistors N23, N24 and N25 are provided for each bit line, constituting the sense amplifier 12 (shown in FIG. 1).

As shown in FIG. 11, by using a latch type sense amplifier for the sense amplifier 12, the bit line disconnecting circuit 11 latches the output of the sense amplifier and disconnects the sense amplifier 12 from the bit line by means of the first stage recognition signal Stage1. Thus, it is possible to concurrently perform the bit line precharge operation and the read data amplifying operation by the sense amplifier 12.

Therefore, as shown in the timing chart of FIGS. 12A through 12I, the read data amplifying operation by the sense amplifier 12 and the precharge operation for the bit lines disconnected by the bit line disconnecting circuit 11 can be executed parallel in the second stage previous to the data output (shown in FIG. 12L).

As described above, according to the aforementioned synchronous MROM, the precharge levels of all the bit lines and all the virtual GND lines are maintained before the column address input. Therefore, the reading can be executed in the access time of the CAS latency of 3, which is equivalent to that of the synchronous DRAM, without increasing the standby current nor the operating current.

The embodiment of the synchronous semiconductor storage device of the invention has been described in connection with the synchronous MROM. However, the synchronous semiconductor storage device is not limited to the synchronous MROM, and the present invention may be applied to the synchronous semiconductor storage devices such as one-time PROMs, EPROMs and non-volatile memories having architecture similar to that of the aforementioned synchronous MROM.

In the aforementioned embodiment, the memory cell array 1 is constructed of the memory blocks Block0 through Blockn that each have eight bit lines BL0 through BL7. However, the number of bit lines is not limited to this and is allowed to be properly set according to the construction of the memory cell array.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A synchronous semiconductor storage device, comprising:

a plurality of memory blocks into which a plurality of memory cells arranged in a matrix form have been divided every plural number of columns;

word lines each activating the memory cells of an identical row in each memory block;

bit lines each connected to one terminal of the memory cells of an identical column of each memory block;

virtual GND lines each connected to the other terminal of the memory cells of an identical column of each memory block;

a column selector that selects any one of the memory blocks on the basis of an input column address in a read operation;

a sense amplifier that holds and amplifies a signal representing a level difference between a reference line and the bit line of the memory block selected by the column selector;

a precharge level supply circuit that supplies a precharge level to the bit lines and the virtual GND lines of the memory blocks other than the memory block selected by the column selector; and a disconnecting circuit that, upon latching of the signal representing the level difference between the reference line and the bit line by the sense amplifier in the read operation, disconnects the bit line and the reference line from the sense amplifier until a next read operation and also disconnects the virtual GND line from the ground potential until the next read operation.

2. A synchronous semiconductor storage device as claimed in claim 1, wherein the precharge level supply circuit retains all the bit lines and virtual GND lines at the precharge level in a standby stage, and in the read operation, stops supplying the precharge level to the bit lines and the virtual GND lines of the memory block selected by the column selector while retaining the precharge level of the bit lines and the virtual GND lines of the memory blocks other than the selected memory block.

3. A synchronous semiconductor storage device as claimed in claim 1, further comprising:

a normal precharge level generating circuit that forms a normal precharge level to be supplied to the bit lines and the virtual GND lines;

a power-on stage precharge level generating circuit that forms a power-on stage precharge level to be supplied to the bit lines and the virtual GND lines in a rise time slower than that of the normal precharge level generating circuit; and a precharge level changeover circuit that supplies the power-on stage precharge level formed by the power-on stage precharge level generating circuit to the precharge level supply circuit in a power supply start stage, and thereafter, changes the precharge level to the normal precharge level formed by the normal precharge level generating circuit upon recognizing that the precharging of all the bit lines and the virtual GND lines with the power-on stage precharge level via the precharge level supply circuit has been completed, to supply the normal precharge level to the precharge level supply circuit.

4. A synchronous semiconductor storage device as claimed in claim 2, further comprising:

a normal precharge level generating circuit that forms a normal precharge level to be supplied to the bit lines and the virtual GND lines;

a power-on stage precharge level generating circuit that forms a power-on stage precharge level to be supplied to the bit lines and the virtual GND lines in a rise time slower than that of the normal precharge level generating circuit; and a precharge level changeover circuit that supplies the power-on stage precharge level formed by the power-on stage precharge level generating circuit to the precharge level supply circuit in a power supply start stage, and thereafter, changes the precharge level to the normal precharge level formed by the normal precharge level generating circuit upon recognizing that the precharging of all the bit lines and the virtual GND lines with the power-on stage precharge level via the precharge level supply circuit has been completed, to supply the normal precharge level to the precharge level supply circuit.

\* \* \* \* \*